US008719744B2

(12) United States Patent
Oshima et al.

(10) Patent No.: US 8,719,744 B2
(45) Date of Patent: May 6, 2014

(54) LANGUAGE CONVERSION METHOD AND LANGUAGE CONVERSION PROGRAM

(75) Inventors: Yoshiki Oshima, Kanagawa (JP); Tadaaki Tanimoto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 90 days.

(21) Appl. No.: 13/492,077

(22) Filed: Jun. 8, 2012

(65) Prior Publication Data

US 2013/0014091 A1 Jan. 10, 2013

(30) Foreign Application Priority Data

Jul. 8, 2011 (JP) ................................ 2011-151529

(51) Int. Cl.
*G06F 17/50* (2006.01)

(52) U.S. Cl.
USPC .......................................................... 716/106

(58) Field of Classification Search
USPC .................................................. 716/100, 106
See application file for complete search history.

(56) References Cited

U.S. PATENT DOCUMENTS 5,999,734 A * 12/1999 Willis et al. ................... 717/149
6,021,266 A 2/2000 Kay
7,386,833 B2 * 6/2008 Granny et al. ................ 717/109
7,904,850 B2 * 3/2011 Spackman et al. ............ 717/136
8,127,113 B1 * 2/2012 Sinha et al. ...................... 712/34
8,291,360 B2 * 10/2012 Higuchi et al. ............... 716/104
2002/0152061 A1 * 10/2002 Shimogori et al. ............. 703/21
2004/0111248 A1 * 6/2004 Granny et al. .................. 703/22
2009/0144690 A1 * 6/2009 Spackman et al. .............. 716/18
2010/0017761 A1 * 1/2010 Higuchi et al. .................... 716/3
2012/0124588 A1 * 5/2012 Sinha et al. ................... 718/102
2012/0144376 A1 * 6/2012 Van Eijndhoven et al. ... 717/146
2012/0144392 A1 * 6/2012 Freitas et al. ................ 718/100

FOREIGN PATENT DOCUMENTS

JP 2003-216668 A 7/2003

* cited by examiner

*Primary Examiner* — Suchin Parihar
(74) *Attorney, Agent, or Firm* — McGinn IP Law Group, PLLC

(57) ABSTRACT

A language conversion method includes a first process in which a computer unit inputs algorithm description data describing an algorithm of hardware under a predetermined description constraint using a program description language, a second process in which the computer unit inputs hardware element specification data specifying parameters representing hardware elements included in the algorithm description data, and a third process in which the computer unit converts the algorithm description data into data of a hardware model based on a system level description language, wherein, in the third process, the computer unit generates a data dependency preservation description which preserves, in the hardware model, data dependency in the algorithm description with regard to a parameter specified in the hardware element specification data.

26 Claims, 23 Drawing Sheets

[MANUAL DESIGN]

[DATA DEPENDENCY]

| ROW NUMBER | VARIABLE | TYPE | DEPENDENCY |
|---|---|---|---|
| 10 | out1 | SUBSTITUTION | — |
| 11 | out1 | REFERENCE | NORMAL DATA DEPENDENCY |
| 20 | out2 | REFERENCE | REVERSE DATA DEPENDENCY |
| 25 | out2 | SUBSTITUTION | — |
| ... | | | |

[FORMAT OF DATA DEPENDENCY TABLE]

[DATA DEPENDENCY PRESERVATION CONVERSION FLOW]

[EXAMPLE OF GENERATING DATA DEPENDENCY PRESERVED CODE (CASE OF DESCRIPTION OF FIG. 8)]

[EXAMPLE OF GENERATING DATA DEPENDENCY PRESERVED CODE (CASE OF DESCRIPTION OF FIG. 9)]

[SYSTEM LEVEL DESCRIPTION CONVERSION FLOW]

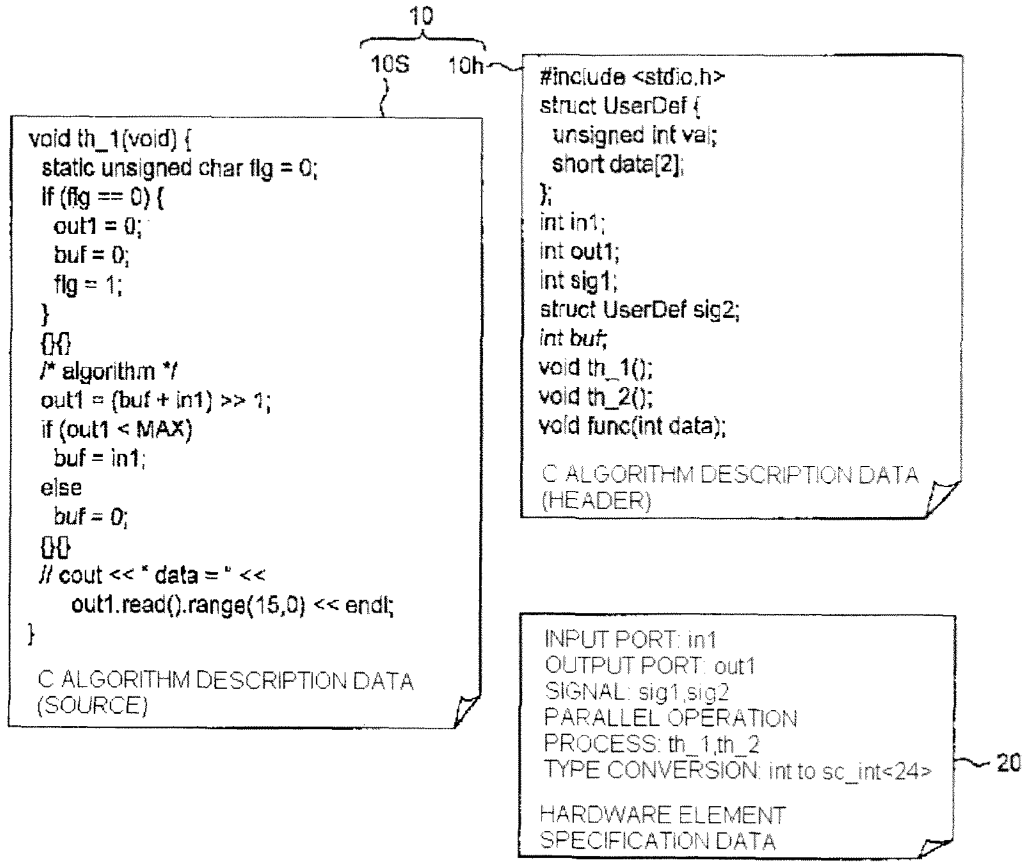

FIG. 16

```
#include <stdio.h>
struct UserDef {
    unsigned int val;
    short data[2];
};
int in1;
int out1;
int sig1;
struct UserDef sig2;
int buf;
void th_1();
void th_2();
void func(int data);
```
C ALGORITHM DESCRIPTION DATA (HEADER)

```
void th_1(void) {
    static unsigned char flg = 0;
    if (flg == 0) {
        out1 = 0;
        buf = 0;
        flg = 1;
    }
    /* algorithm */
    out1 = (buf + in1) >> 1;
    if (out1 < MAX)
        buf = in1;
    else
        buf = 0;
    // cout << " data = " <<
    out1.read().range(15,0) << endl;
}
```
C ALGORITHM DESCRIPTION DATA (SOURCE)

```
INPUT PORT: in1
OUTPUT PORT: out1
SIGNAL: sig1,sig2
PARALLEL OPERATION
PROCESS: th_1,th_2
TYPE CONVERSION: int to sc_int<24>
```
HARDWARE ELEMENT SPECIFICATION DATA

[EXAMPLE OF C ALGORITHM DESCRIPTION AND HARDWARE ELEMENT SPECIFICATION DATA]

```
void th_1() {
  int _out1;

  static unsigned char flg = 0;
  if (flg == 0) {
    out1 = 0;
    buf = 0;
  }
  {}{}
  /* algorithm */
  _out1 = (buf + in1) >> 1;
  out1 = _out1;
  if (_out1 < MAX)
    buf = in1;
  else
    buf = 0;
  {}{}
  // cout << " data = " <<
       out1.read().range(15,0) << endl;
}
```

[DATA DEPENDENCY PRESERVED CODE]

FIG. 18

```
SC_MODULE( module ) {
  sc_in_clk clk;
  sc_in < bool > rst;
  sc_in < sc_int<24> > in1;
  sc_out < sc_int<24> > out1;
  sc_signal < sc_int<24> > sig1;
  sc_signal < UserDef > sig2;
  int buf;

  void th_1();
  void th_2();
  void func(int data);

  SC_CTOR( module ) :
   in1("in1"), out1("out1"), sig1("sig1"), sig2("sig2") {
    SC_CTHREAD( th_1, clk.pos() );
    reset_signal_is( rst, false );

    SC_CTHREAD( th_2, clk.pos() );
    reset_signal_is( rst, false );
  }
};
```

DS1 (PORT DECLARATION)

DS2 (SIGNAL DECLARATION)

DS3 (REGISTRATION OF PARALLEL PROCESS)

[CLASS DEFINITION SECTION GENERATION CODE OF HARDWARE MODEL (CASE OF SYSTEM C)]

*FIG. 19*

```
class UserDef {
public:
  unsigned int val;
  short data[2];

  UserDef() {
    val = 0;
    for (int _i0_ = 0; _i0_ < 2; _i0_++)
      data[_i0_] = 0;
  }

  inline bool operator == (const UserDef& rhs) const {
    bool _val = true;
    bool _data = true;

    _val = rhs.val == val;
    for (int _i0_ = 0; _i0_ < 2; _i0_++)
      _data &= rhs.data[_i0_] == data[_i0_];
    return _val && _data;
  }

  . . .
  inline UserDef operator -- (int) {
    UserDef tmp = *this;
    val--;
    for (int _i0_ = 0; _i0_ < 2; _i0_++)
      data[_i0_]--;
    return tmp;
  }
}
```

DS4 (OVERLOAD OF OPERATOR)

[USER-DEFINED TYPE CLASS GENERATION CODE (CASE OF SYSTEM C)]

FIG. 20

```
void module::th_1() {
  sc_int<24> _out1;

  out1.write(0);
  buf = 0;
  wait();
  while (1) {
    /* algorithm */
    _out1 = (buf + in1.read()) >> 1;
    out1.write(_out1);
    if (_out1 < MAX)
      buf = in1.read();
    else
      buf = 0;
    wait();
    cout << " data = " <<
       out1.read().range(15,0) << endl;
  }
}
```

DS5 (RESETTING PROCESS)

DS6 (INFINITE LOOP)

[PARALLEL PROCESS GENERATION CODE (CASE OF SYSTEM C)]

FIG. 21

```
SC_MODULE( module_test ) {
  sc_in_clk clk;
  sc_out < bool > rst;
  sc_out < sc_int<24> > in1;
  sc_in < sc_int<24> > out1;

  SC_CTOR(module_test) {
    SC_THREAD( th_test )
    sensitive << clk.pos();
    dont_initialize();
  }

  void th_test() {
    int _i0_;
    sc_int<24>* in1_vector = new sc_int<24> [DATA_MAX];
    std::ofstream ofs( "SystemC_Sim.result", std::ios::out | std::ios::app);
    for (_i0_ = 0; _i0_ <= DATA_MAX-1; _i0_++) {
      in1_vector[_i0_] = ((0x0000ffff & rand() << 16)
                                      | (0x0000ffff & rand()));
    }
    rst.write(true);
    wait(5, SC_NS);
    ...
    for ( _i0_ = 0; _i0_ < DATA_MAX-1; _i0_++) {
      in1.write(i1_vector[_i0_]);
      ofs_out<< "out = " << hex << out << std::endl;
      wait();
    }
    ...
  }
};
```

DS7 (GENERATE RANDOM TEST VECTOR)

DS8 (ACQUIRE LOG OF OUTPUT RESULT)

[TEST BENCH DESCRIPTION 1
(TEST BENCH MODULE FOR HARDWARE MODEL)]

*FIG. 22*

```
int sc_main(int argc, char *argv[]) {

  sc_clock  clk("clk", 10, SC_NS, 0.5, 1, SC_NS, true);
  sc_signal <bool>  rst;
  sc_signal < sc_int<24> >  in1;
  sc_signal < sc_int<24> >  out1;

  module dut("dut");
  module_test test("dut_test");

  dut.clk( clk );
  dut.rst( rst );
  dut.in1( in1 );
  dut.out( out1 );
  test_dut.clk( clk );
  test_dut.rst( rst );
  test_dut.in1( in1 );
  test_dut.out1( out1 );

  sc_start();
  return 0;
}
```

DS9 (CREATE HARDWARE MODE)

DS10 (CREATE TEST BENCH MODEL)

DS11 (CONCATENATE HARDWARE MODEL AND TEST BENCH MODEL)

[TEST BENCH DESCRIPTION 2 (CONCATENATION AND SIMULATION OF HARDWARE MODEL AND TEST BENCH MODEL)]

*FIG. 23*

```
Int main() {
  int In1_vector[1027];
  unsigned int _i0_;

  FILE *fp_out1;
  srand(0);

  fp_out1 = fopen("out1.result", "w");
  if (fp_out1 == NULL) {
    puts("Cannot open file : out1.result");
    exit(1);
  }
  for (_i0_ = 0; _i0_ <= 1026; _i0_++) {
    in1_vector[_i0_] = ((0x0000ffff & rand() << 16) | (0x0000ffff & rand()));
  }
  for (_i0_ = 0; _i0_ <= 1026; _i0_++) {
    in1 = in1_vector[_i0_];
    th_1();
    th_2();
    fprintf(fp_out1, "out1 = %d¥n", out1);
  }
  fclose(fp_out1);
  return 0;
}
```

DS12 (GENERATE RANDOM TEST VECTOR)

DS13 (CALL ALGORITHM FUNCTION AND ACQUIRE LOG OF PROCESSING RESULT)

[TEST BENCH DESCRIPTION 3 (TEST BENCH FOR C ALGORITHM)]

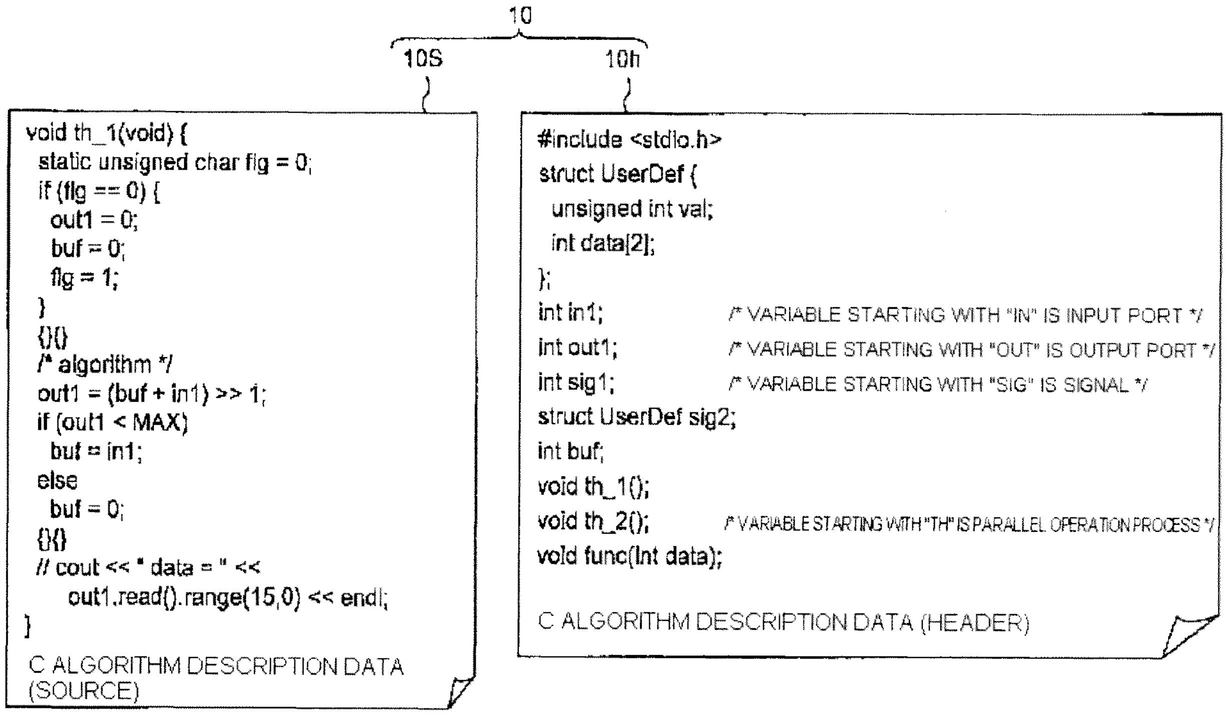

FIG. 24

```
#include <stdio.h>
struct UserDef {
  unsigned int val;
  int data[2];
};
int in1;                /* VARIABLE STARTING WITH "IN" IS INPUT PORT */
int out1;               /* VARIABLE STARTING WITH "OUT" IS OUTPUT PORT */
int sig1;               /* VARIABLE STARTING WITH "SIG" IS SIGNAL */
struct UserDef sig2;
int buf;
void th_1();
void th_2();            /* VARIABLE STARTING WITH "TH" IS PARALLEL OPERATION PROCESS */
void func(int data);
```

C ALGORITHM DESCRIPTION DATA (HEADER) — 10h

```
void th_1(void) {
  static unsigned char flg = 0;
  if (flg == 0) {
    out1 = 0;
    buf = 0;
    flg = 1;
  }
  {|}
  /* algorithm */
  out1 = (buf + in1) >> 1;
  if (out1 < MAX)
    buf = in1;
  else
    buf = 0;
  // cout << " data = " <<
      out1.read().range(15,0) << endl;
}
```

C ALGORITHM DESCRIPTION DATA (SOURCE) — 10S

10 { 10h, 10S }

[EXAMPLE OF HARDWARE ELEMENT SPECIFICATION ACCORDING TO NAMING RULE]

LANGUAGE CONVERSION METHOD AND LANGUAGE CONVERSION PROGRAM

CROSS-REFERENCE TO RELATED APPLICATION

The disclosure of Japanese Patent Application No. 2011-151529 filed on Jul. 8, 2011 including the specification, drawings and abstract is incorporated herein by reference in its entirety.

BACKGROUND

The present invention relates to a bridging technique for high-level synthesis which converts data describing an algorithm of hardware using a highly abstract program description language such as C language into a system level description language such as System C which can describe functions specific to hardware such as the time concept or parallel processing, and relates to a compilation method which works as abridge to high-level synthesis, for example, and further to a technique effectively applicable to compilers.

While limitations of the Register Transfer Level (RTL) design is being alarmed as System-on-Chip semiconductor integrated circuits (also simply referred to as SoC) have become more highly integrated and more complicated, an approach of efficiently performing hardware design is becoming widespread, which uses a hardware model (simply referred to as HW model hereinafter) described based on C language or C++ language which are more highly abstract than the hardware description language (HDL). As representative techniques, there are high-level synthesis techniques which generate RTL from a hardware model or hardware/software co-verification techniques using virtual platforms.

Since pure C language or C++ language cannot express the concept of time, parallel processing, or the like, it is difficult to describe functions specific to the hardware. Therefore, a system level description language (e.g., SystemC, etc.) with an ability of expressing the hardware added to C language and C++ language is used for developing HW models.

The high-level synthesis technique is a technique of automatically generating an RTL with the system level description language as the input, and aims at reducing the TAT (turn-around time) for developing various products. As a currently wide-spread high-level synthesis tool, there is the Cynthesizer, which is a product of Forte Design Systems.

The hardware/software co-verification technique using a virtual platform is a technique which allows high-speed co-verification simulation at a stage earlier than completion of the hardware, by designing a system including hardware and software using a common system level description language. As a virtual platform, there is the Platform Architect, which is a product of Synopsys.

In order to employ the techniques described above, it is necessary to create a HW model using system level description language based on the C language description of a part to be the hardware. However, no useful technique is provided to work as a bridge to high-level synthesis, which has been performed manually. For example, a part related to input from and output to the outside of the model, i.e., extracting a variable of outside access with a bus or memory, wrapping the target algorithm for the extracted I/O port, and defining exchange between the variable corresponding to external access and the port, are manually performed.

On the other hand, as a technique which does not take into consideration bridging to such high-level synthesis, there is one described in Patent Document 1 (Japanese Patent Laid-Open No. 2003-216668), for example. According to Patent Document 1, an integrated circuit is designed by defining its function using a programming language which supports parallel processing and synchronous communication, an acquired source code is given to a compiler, and the compiler generates, via an optimizer module which changes the timing of synchronous communication without changing the order of external communication of the integrated circuit, an output code by HDL expressing the circuit configuration of the integrated circuit.

SUMMARY

The followings have become clear according to examination of the inventors. First, manually conversion for bridging to high-level synthesis requires analysis and verification of the resulting system level description with regard to its equivalence with the algorithm description as a basis. However, code analysis tools for system level description languages are still immature and thus it is not easy to perform analysis and debugging of memory leaks, memory destruction, uninitialized variables, out of array access, or the like, which may significantly increase development man-hours. In short, it becomes necessary, on both the algorithm description by the original C language and the hardware model based on the system level description after manual rewriting, to perform code analysis verification and debugging such as uninitialized variable check, and, in the first place, errors may easily be mixed therein due to manual rewriting.

Second, as disclosed in Patent Document 1, in the case of a synthesis technique per se which does not works as a bridge to high-level synthesis tools, it is necessary to perform the description considering the hardware from the beginning using extended C language such as parallel syntax and communication syntax, which is practically nearly impossible as the target of design becomes much more highly integrated and highly complicated.

The present invention has been made in view of the above circumstances and provides a language conversion method which can contribute to reduction of man-hours for designing a hardware model for high-level synthesis based on a hardware algorithm description by a program description language, and further to enhancement of development efficiency of semiconductor integrated circuits, which are becoming much more highly integrated and complicated.

It is another object of the invention to provide a language conversion program which can readily implement a language conversion method which can contribute to reduction of man-hours for designing a hardware model for high-level synthesis based on a hardware algorithm description using a program description language, and further to enhancement of development efficiency of semiconductor integrated circuits, which are becoming much more highly integrated and complicated.

The other purposes and the new feature of the present invention will become clear from the description of the present specification and the accompanying drawings.

The following explains briefly the outline of a typical invention among the inventions disclosed in the present application.

In other words, when algorithm description data describing an algorithm of hardware is converted into data of a hardware model by a system level description using a program description language, data dependency preservation description, which preserves in the system level description dependency of data in the algorithm description with regard to a parameter as the hardware element included in the algorithm description data, is generated.

Accordingly, when the algorithm description is converted into the system level description expressing the concept of time and parallel processing specific to hardware, the data dependency assumed in the algorithm description is preserved in the data dependency preservation description, and thus the result of previous evaluation and verification for the algorithm description has been reflected in the hardware model which has been converted from the algorithm description into the system level description, whereby evaluation and verification need not be repeated even if a different language is used for the converted hardware model.

The following explains briefly the effect acquired by the typical invention among the inventions disclosed in the present application.

In other words, the invention can contribute to reduction of man-hours for designing a hardware model for high-level synthesis based on a hardware algorithm description using a program description language, and further to enhancement of development efficiency of semiconductor integrated circuits, which are becoming much more highly integrated and complicated.

BRIEF DESCRIPTION OF THE DRAWINGS

FIG. 11 is an explanatory view illustrating a data dependency table;

FIG. 16 is an explanatory view illustrating a specific example of C algorithm description data 10 and hardware element specification data 20 as input data of the automatic conversion S3 of FIG. 6;

FIG. 17 is an explanatory view illustrating a specific example of data dependency preserved code generated by the process flow of FIG. 12 in the data dependency preservation conversion S33 in the automatic conversion S3;

FIG. 18 is an explanatory view illustrating a description of a class definition section of the hardware model generated by the system level description conversion;

FIG. 19 is an explanatory view illustrating a description of a user-defined type class generated by the system level description conversion;

FIG. 20 is an explanatory view illustrating a description of a parallel process generated by the system level description conversion;

FIG. 21 is an explanatory view illustrating a description of a test bench module generated by the system level description conversion;

FIG. 22 is an explanatory view illustrating a description of concatenation and simulation of the test bench module generated by the system level description conversion;

FIG. 23 is an explanatory view illustrating a description of a test bench for C algorithm generated by the system level description conversion; and FIG. 24 is an explanatory view illustrating a C algorithm description when hardware element specification data becomes unnecessary by employing a naming rule for parameters.

DETAILED DESCRIPTION

1. Outline of Embodiments

Figure 1:
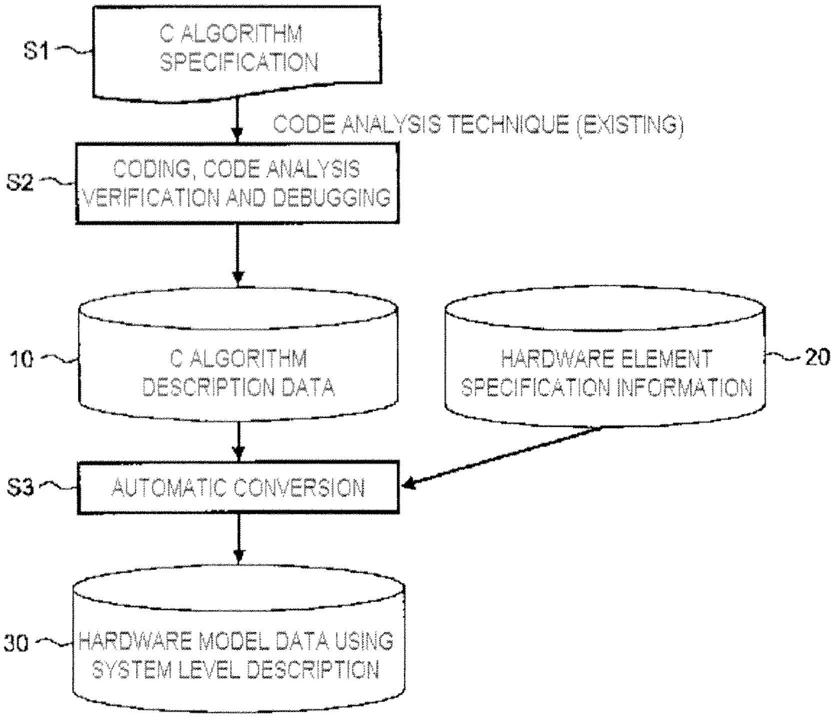
FIG. 1 is a flow chart illustrating an overall process (language conversion) of converting a C algorithm description describing a required hardware algorithm using C language into a hardware model based on a system level description language.

First, the following explains briefly the outline of a typical embodiment of the inventions disclosed in the present application. Reference numerals of the drawings referred to in the outline explanation of representative embodiments in a parenthesized manner are only illustrative of what are included in the concept of the components to which they are provided.

[1] <Preserve Data Dependency and Convert Algorithm Description into System Level Description, Upon Receiving Instruction from Hardware Element>

A language conversion method according to a representative embodiment of the present invention includes: a first process in which a computer unit (1) inputs algorithm description data (10) describing an algorithm of hardware under a predetermined description constraint using a program description language; a second process in which the computer unit inputs hardware element specification data (20) specifying parameters representing hardware elements included in the algorithm description data; and a third process (S3) in which the computer unit converts the algorithm description data into data of a hardware model based on a system level description. In the third process, the computer unit generates a data dependency preservation description (42) which preserves, in the hardware model, data dependency in the algorithm description with regard to a parameter specified in the hardware element specification data.

Accordingly, when the algorithm description is converted into the system level description expressing the concept of time and parallel processing specific to hardware, the data dependency assumed in the algorithm description due to the description constraint is preserved in the data dependency preservation description, with the result of previous evaluation and verification for the algorithm description being reflected in the hardware model which has been converted from the algorithm description into the system level description, and therefore evaluation and verification such as code analysis or debugging need not be repeated even if a different language is used for the converted hardware model. Furthermore, since the parameters representing hardware elements can be specified later by the hardware element specification data, workload of preliminarily grasping parameters representing ports or signals (registers) can be saved when generating an algorithm description.

[2] <Description Constraint with Regard to Number of Clock Cycles of Function Operation>

In the language conversion method of item 1, the description constraint includes a constraint that, when a process based on the system level description language is a clock synchronous process, an operation by a function of the program description is completed within a certain clock cycle.

Accordingly, a description based on a program description language which lacks the concept of time can be provided with an implicit time concept.

[3] <Preserve Order Relation>

Figure 8:
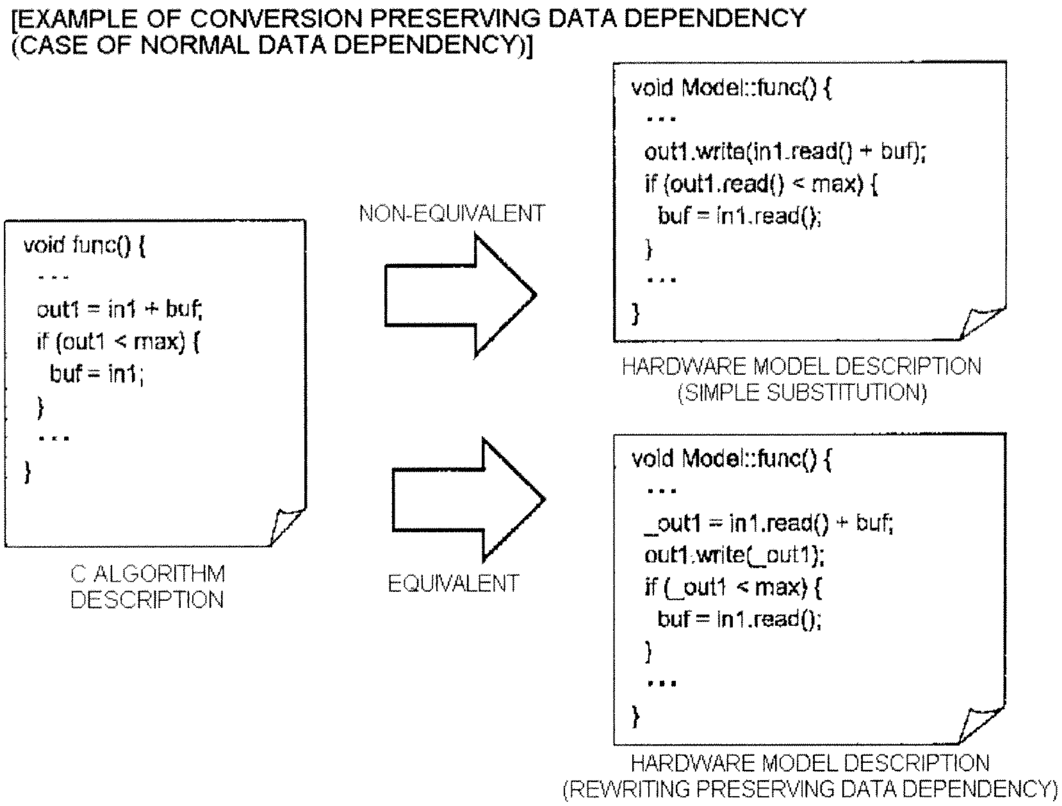
FIG. 8 is an explanatory view illustrating an exemplary hardware model description for a C algorithm description having forward data dependency.
Figure 9:
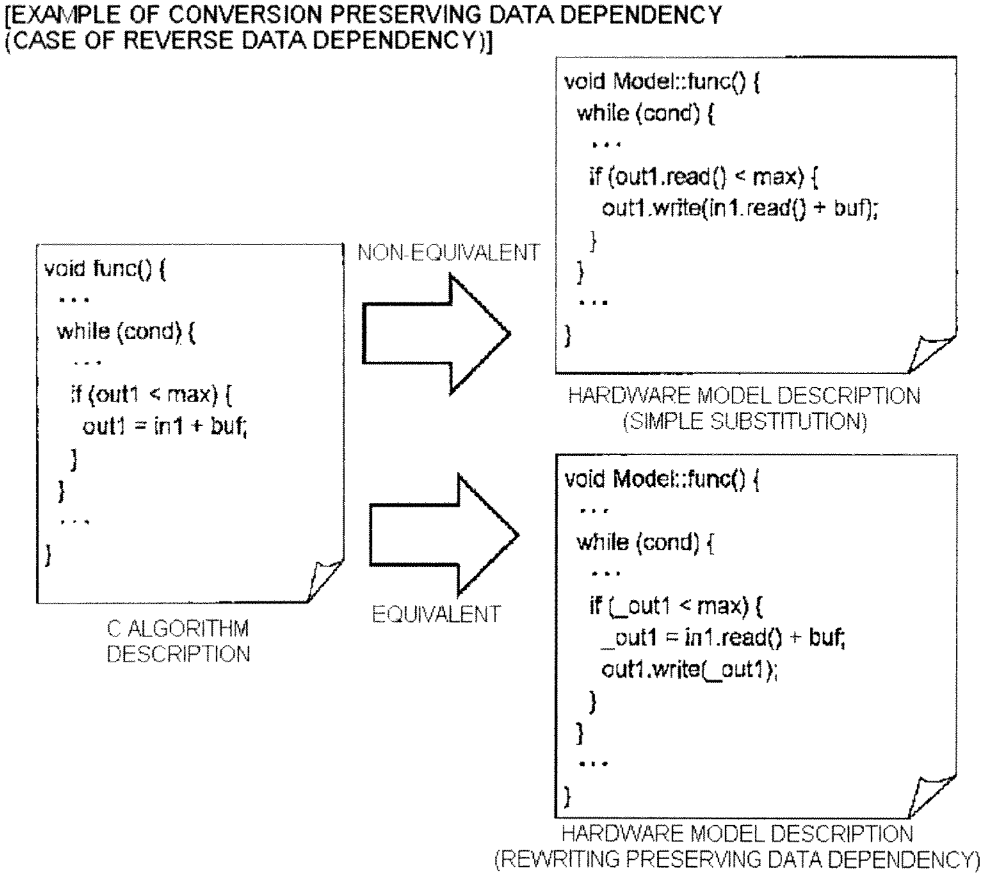
FIG. 9 is an explanatory view illustrating an exemplary hardware model description for a C algorithm description having backward data dependency.

In the language conversion method of item 1 or 2, the data dependency preservation description preserves the order of substitution and reference to parameters, and assures that the substituted value is referred to within the certain clock cycle from the substitution operation thereof (see FIGS. 8 and 9)

Accordingly, the data dependency assumed in the algorithm description can be reflected in the system level description by a simple description.

[4] <Employ Intermediate Parameters>

In the language conversion method of any one of items 1 to 3, the data dependency preservation description includes in the algorithm description data a description which defines an intermediate parameter (_out1) for a parameter to be referred to after substitution therein, substitutes, into the intermediate parameter, a value to be substituted into the parameter, and subsequently writes the value of the intermediate parameter into the parameter; and a description which defines the reference destination of the value as the intermediate parameter.

Accordingly, considering the delay until the result of writing is reflected in a parameter to be a port or a signal (register), preservation of the data dependency can be easily realized by defining and using the intermediate parameter, when an operation of referring to the written data within a certain clock cycle is assumed.

[5] <Generate Data Dependency Table>

In the language conversion method of any one of items 1 to 4, the third process generates a data dependency table (41) indicating which of reference or substitution comes first according to the order of description lines in the algorithm description, and uses the table to generate the data dependency preservation description.

Accordingly, data dependency can be easily determined without generating a control data flow graph.

[6] <Hardware Element Specification Information>

In the language conversion method of any one of items 1 to 5, the hardware element specification data includes information specifying a parameter to be an input port (in1), information specifying a parameter to be an output port (out1), and information specifying a parameter (sig1 or sig2) representing a signal (register).

Accordingly, parameters representing an input port, an output port, and a signal (register) can be easily specified.

[7] <Specify Parallel Process>

In the language conversion method of any one of items 1 to 6, the hardware element specification data further specifies a process which performs parallel processing (th__1 and th__2).

Accordingly, a process which performs parallel processing can be easily specified.

[8] <"//" Type Comment>

In the language conversion method of any one of items 1 to 7, the algorithm description data has a description unsupported by the program description language as a "//" type comment, and the third process reflects the "//" type description in the system level description.

Accordingly, preliminarily embedding, in the algorithm description, a description specific to the hardware model which is difficult to be handled by automatic conversion can be of aid for the conversion by the third process, which may contribute to improvement of the conversion precision by the third process.

[9] <Convert Description of "{ } { }" into Description of Clock Boundary>

In the language conversion method of any one of items 1 to 8, the third process converts a description of "{ } { }" included in the algorithm description data into description of the clock boundary.

Accordingly, preliminarily embedding, in the algorithm description data, a description implying the clock boundary better contributes to improvement of clarification and readability of the meaning.

[10] <Generate Test Bench of Hardware Model>

In the language conversion method of any one of items 1 to 9, the third process includes test bench generation (S124) in which the computer unit generates a test bench for verifying the function and operation timing of the converted hardware model.

Accordingly, using the generated test bench facilitates evaluating and verifying the hardware model.

[11] <Concept of Parallel Processing and Time>

In the language conversion method of any one of items 1 to 10, the program description language is C language which lacks the concept of parallel processing and time, and the system level description language is System C language which has the concept of parallel processing and time.

Accordingly, it becomes possible to automatically rewrite the algorithm description data described using C language into data of a hardware model based on System C language or the like.

[12] <Automatically Determine Hardware Element, Preserve Data Dependency, and Convert Algorithm Description into System Level Description>

A language conversion method according to another embodiment of the present invention includes: a first process in which a computer unit (1) inputs algorithm description data (10) describing an algorithm of hardware under a predetermined description constraint using a program description language; and a second process in which the computer unit determines parameters representing hardware elements included in the algorithm description data according to a naming rule of parameters (variables beginning with "in" represent input ports, variables beginning with "out" represent output ports, variables beginning with "sig" represent signals, and variables beginning with "th" represent parallel processing processes), and the computer unit converts the algorithm description data into data of a hardware model based on the system level description. In the second process, the computer unit generates a data dependency preservation description (42) which preserves, in the hardware model, data dependency in an algorithm description with regard to the determined parameter.

Accordingly, when the algorithm description is converted into the system level description expressing the concept of time and parallel processing specific to hardware, the data dependency assumed in an algorithm description satisfying the description constraint is preserved by the data dependency preservation description, with the result of previous evaluation and verification for the algorithm description being reflected in the hardware model which has been converted from the algorithm description into the system level description, and therefore evaluation and verification such as code analysis or debugging need not be repeated even if a different language is used for the converted hardware model. Furthermore, since the parameters representing hardware elements are automatically determined based on the naming rule, data such as the hardware element specification data of item 1 is not required. However, parameters supposed to represent hardware elements must be provided with parameter names according to the naming rule.

[13] <Description Constraint with Regard to Number of Clock Cycles of Function Operation>

In the language conversion method of item 12, the predetermined description constraint includes a constraint that the operation by a function of a program description is completed within a certain clock cycle, if the process based on the system level description language is a clock synchronous process.

Accordingly, an implicit time concept can be introduced in a description based on the program description language which lacks the concept of time.

[14] <Preserve Order Relation>

In the language conversion method of item 12, the data dependency preservation description is a description which preserves the order of substitution and reference to parameters, and assures that the substituted value is referred to within a certain clock cycle from the substitution operation thereof.

Accordingly, data dependency assumed in an algorithm description can be reflected in the system level description by a simple description.

[15] <Employ Intermediate Parameter>

In the language conversion method of any one of items 12 to 14, the data dependency preservation description includes in the algorithm description data a description which defines an intermediate parameter (_out1) for a parameter to be referred to after substitution therein, substitutes, into the intermediate parameter, a value to be substituted into the parameter, and subsequently writes the value of the intermediate parameter into the parameter; and a description which defines the reference destination of the value as the intermediate parameter.

Accordingly, considering the delay until the result of writing is reflected in a parameter to be a port or a signal (register), it becomes possible to easily realize preservation of the data dependency by defining and using the intermediate parameter when an operation of referring to the write data within a certain clock cycle is assumed.

[16] <Generate Data Dependency Table>

In the language conversion method of any one of items 12 to 15, the second process generates the data dependency table (41) indicating which of reference or substitution comes first according to the order of description lines in the algorithm description, and uses the table to generate the data dependency preservation description.

Accordingly, data dependency can be easily determined without generating a control data flow graph.

[17] <Hardware Elements Specified by Naming Rule>

In the language conversion method of any one of items 12 to 16, parameters representing the hardware elements according to the naming rule include a first parameter (in1) to be an input port, a second parameter to be an output port (out1), and a third parameter (sig1 or sig2) to be a signal (register).

Accordingly, parameters representing an input port, an output port, and a signal (register) can be easily identified.

[18] <Parallel Process Specified by Naming Rule>

In the language conversion method of any one of items 12 to 17, the second process further includes processing of determining a process (th_1 or th_2) which performs parallel processing included in the algorithm description data according to a naming rule of processes.

Accordingly, a process which performs parallel processing can be easily identified.

[19] <"//" Type Comment>

In the language conversion method of any one of items 12 to 18, the algorithm description data has a description unsupported by the program description language as a "//" type comment, and the second process reflects the "//" type description in the system level description.

Accordingly, preliminarily embedding, in the algorithm description, a description specific to the hardware model which is difficult to be handled by automatic conversion can be of aid for the conversion by the third process, which may contribute to improvement of the conversion precision by the third process.

[20] <Convert Description of "{ } { }" into Description of Clock Boundary>

In the language conversion method of any one of items 12 to 19, the second process converts a description of "{ } { }" included in the algorithm description data into a description of the clock boundary.

Accordingly, preliminarily embedding, in the algorithm description data, a description implying the clock boundary better contributes to improvement of clarification and readability of the meaning.

[21] <Generate Test Bench of Hardware Model>

In the language conversion method of any one of items 12 to 20, the second process includes test bench generation (S124) in which the computer unit generates a test bench for verifying the function and operation timing of the converted hardware model.

Accordingly, using the generated test bench facilitates evaluating and verifying the hardware model.

[22] <Concept of Parallel Processing and Time>

In the language conversion method of any one of items 12 to 21, the program description language is C language which lacks the concept of parallel processing and time, and the system level description language is System C language which has the concept of parallel processing and time.

Accordingly, it becomes possible to automatically rewrite the algorithm description data described using C language into data of a hardware model based on System C language or the like.

[23] <Preserve Data Dependency and Convert Algorithm Description into System Level Description, Upon Receiving Instruction from Hardware Element>

A language conversion program (PGM) according to still another embodiment of the present invention controls, by causing a computer unit (1) to execute, a first process of inputting algorithm description data (10) describing an algorithm of hardware under a predetermined description constraint using a program description language; a second process of inputting hardware element specification data specifying parameters representing hardware elements included in the algorithm description data; a third process (S32 or S33) of generating a data dependency preservation description for specifying data dependency in the algorithm description with regard to a parameter specified in the hardware element specification data which has been input in the second process; and a fourth process (S34) of converting the algorithm description data into data of a hardware model based on the system level description and reflecting, in the hardware model, the data dependency specified by the data dependency preservation description.

Accordingly, a language conversion method which can contribute to reduction of man-hours for designing a hardware model for high-level synthesis based on a hardware algorithm description using a program description language can be easily realized as described in item 1.

[24] <Automatically Determine Hardware Element, Preserve Data Dependency, and Convert Algorithm Description into System Level Description>

A language conversion program (PGM) according to still another embodiment of the present invention controls, by causing a computer unit (1) to execute, a first process of inputting algorithm description data (10) describing an algorithm of hardware under a predetermined description constraint using a program description language; a second process (S31) of determining parameters representing hardware elements included in the algorithm description data according to a naming rule of parameters (variables beginning with "in" represent input ports, variables beginning with "out" represent output ports, variables beginning with "sig" represent signals, and variables beginning with "th" represent parallel processing processes); a third process (S32 or S33) of generating a data dependency preservation description for specifying data dependency in the algorithm description with regard to a parameter specified in the hardware element specification data which has been input in the second process; and a fourth process (S34) of converting the algorithm description data into data of a hardware model based on the system level description and reflecting, in the hardware model, the data dependency specified by the data dependency preservation description.

Accordingly, a language conversion method which can contribute to reduction of man-hours for designing a hardware model for high-level synthesis based on a hardware algorithm description using a program description language can be easily realized as described in item 12.

2. Details of Embodiments

Embodiments will be described in further detail.

First Embodiment

<<Automatic Conversion from C Algorithm to Hardware Model>>

A process (language conversion) of converting a C algorithm description describing a required hardware algorithm using, for example, C language as the software programming language into a hardware model based on the system level description language will be described in general, referring to FIG. 1. The software programming language lacks the concept of parallel processing and time. In contrast, the system level description language has the concept of parallel processing and time.

Figure 7:
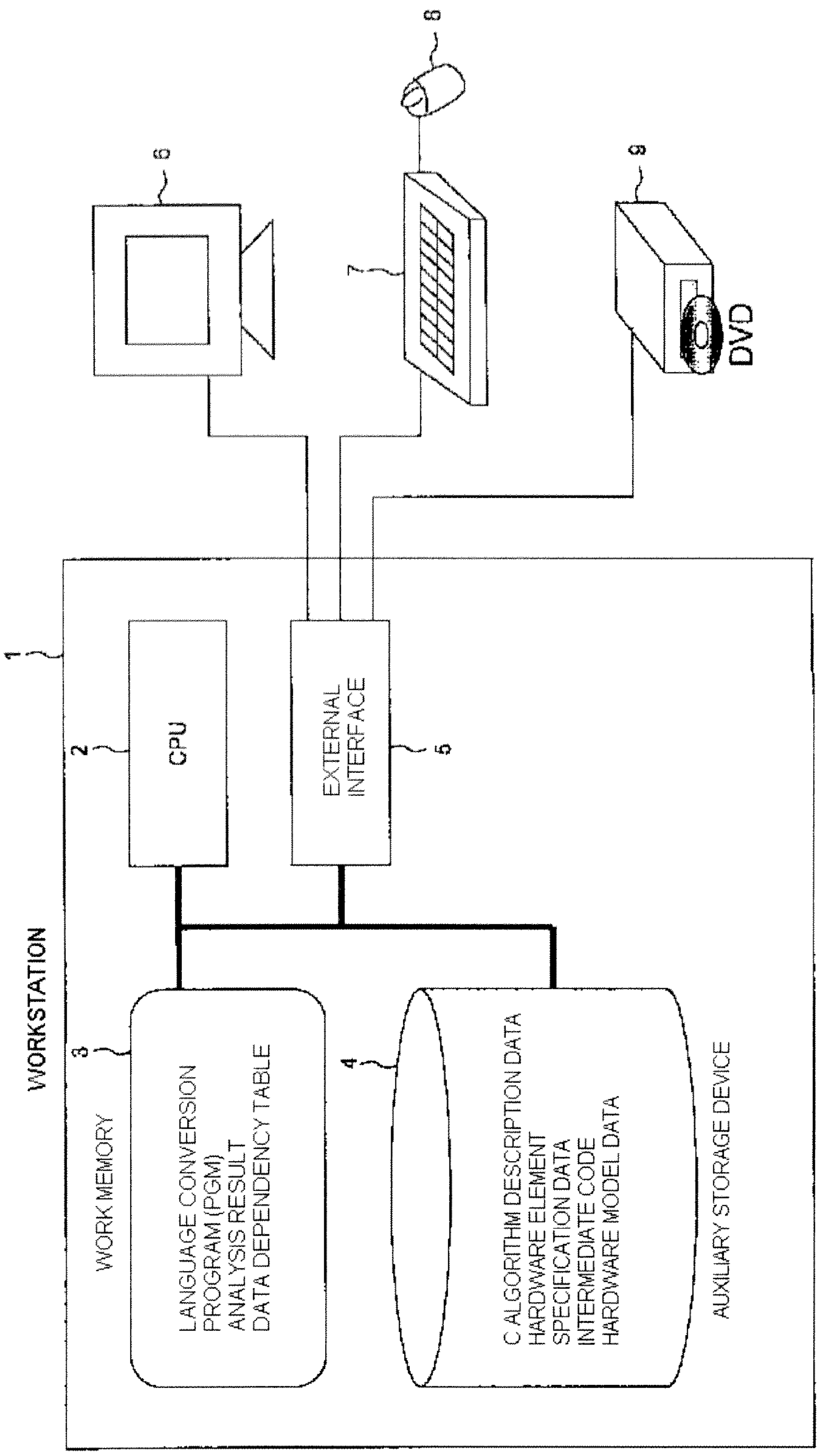
FIG. 7 is a block diagram illustrating an exemplary computer unit which performs language conversion shown in FIG. 1.

The process flow shown in FIG. 1 is realized by causing a computer unit such as an engineering work station, for example to execute a program such as a language conversion program. A work station 1, having a work memory 3 and an auxiliary memory 4 coupled to a Central Processing Unit (CPU) 2 which executes a program, as shown in FIG. 7 for example, is coupled to a display 6, a keyboard 7, a mouse 8, and a DVD drive 9 or the like, via an external interface 5. The CPU 2 downloads a language processing conversion program to the auxiliary memory from the DVD drive 9, transfers the downloaded language processing conversion program to the work memory 3 as necessary, and fetches the program from the work memory 3 to perform language conversion.

The function required for the circuit module to be developed is input as a C algorithm specification, according to the grammar of C language, in order to describe the hardware algorithm under a predetermined description constraint (S1). The input specification is encoded into a C algorithm description based on C language, and the encoded code 10 (also simply referred to as C algorithm description data in the following) is analyzed and verified, which is then subject to debugging (S2). When C language is used, for example, verification and debugging can be easily performed using a commercial dynamic code analysis tool represented by Purify in [1], or an academic verification tool such as [2]and [3]. [1]: IBM Rational Purify http://www-01.ibm.com/software/awdtools/purify/, [2]: CBMC http://.cprover.org/cbmc/ [3]: Edmund Clarke, Daniel Kroening, and Flavio Lerda, "A Tool for Checking ANSI-C Programs," TACAS2004, LNCS Vol. 2988, pp. 168-176, 2004.

Accordingly, C algorithm description data 10 describing the required hardware algorithm is generated using C language. In order to express the concept of parallel processing and time for the C algorithm description data 10, hardware specification data 20 specifying parameters representing hardware elements included in the C algorithm description data 10 is input to automatically convert the C algorithm description data 10 into the system level description such as System C and generate hardware model data 30 (S3). The hardware model data 30 is used for high-level synthesis to the Register Transfer Level (RTL), and further for generating a test bench for timing verification of the hardware model. As a high-level synthesis tool which performs high-level synthesis, Cynthesizer available from the Forte Design Systems, for example, may be used.

Figure 2:
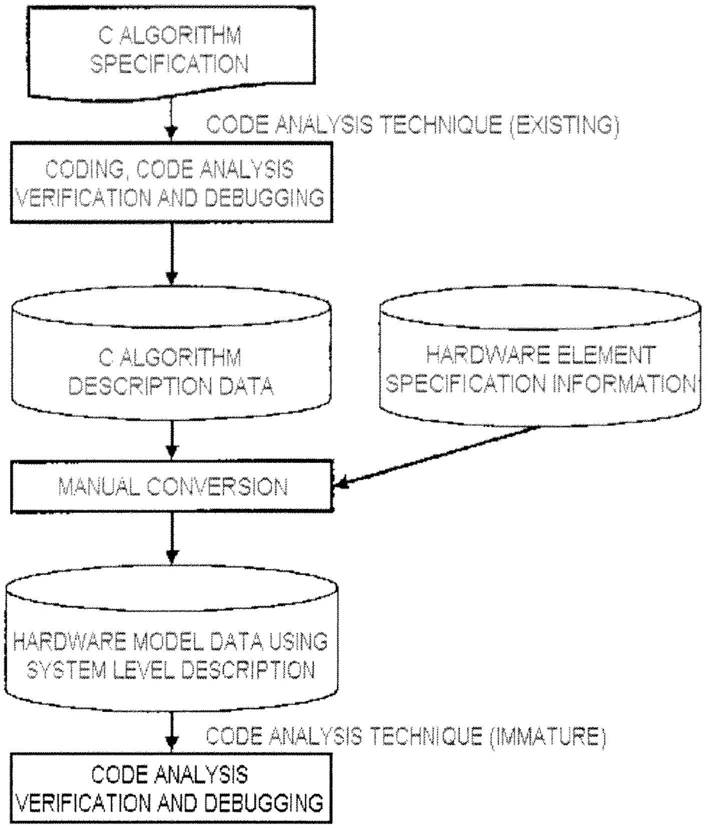
FIG. 2 is a flow chart illustrating an overall process relating to a comparative example in which conversion into the system level description is manually performed.

In the automatic conversion S3, the hardware model data 30 of the system level description is subject to conversion so that functional equivalence to the C algorithm description data 10 is assured. Since manual conversion into the system level description as with the comparative example of FIG. 2 cannot assure the equivalence in the conversion result, it becomes necessary to additionally perform code analysis, verification and debugging of the system level description. Furthermore, code analysis tools for system level description languages are still immature and thus it is not easy to perform analysis and debugging of memory leaks, memory destruction, uninitialized variables, out of array access, or the like, which causes increase in development man-hours of hardware model.

Figure 3:
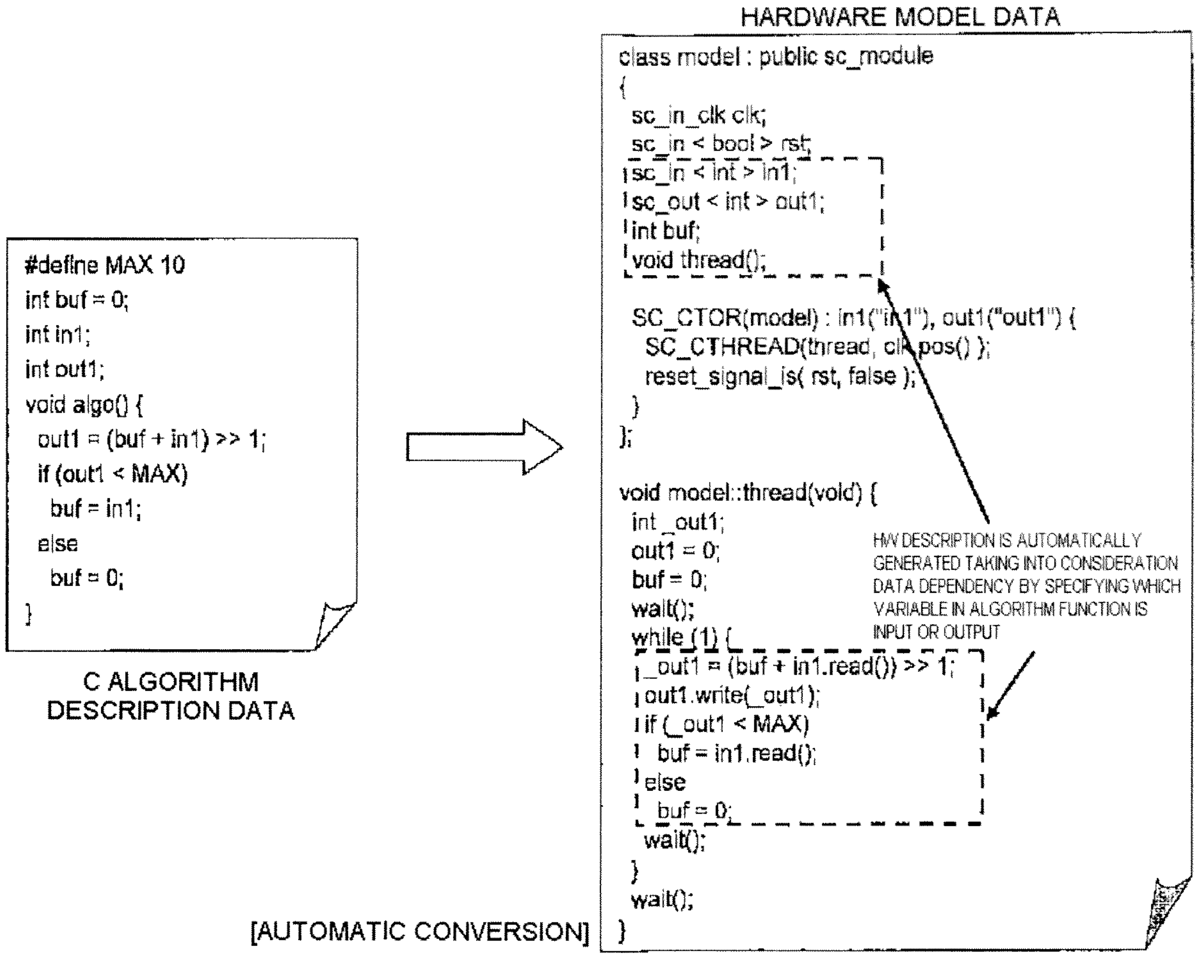
FIG. 3 is an explanatory view illustrating an exemplary result of automatically converting C algorithm description data into a hardware model data at step S3.

FIG. 3 illustrates an exemplary result of automatically converting the C algorithm description data 10 into the hardware model data 30 at step S3. In contrast, FIG. 4 illustrates, as a comparative example, a result of manually converting the C algorithm description data into the hardware model data.

Figure 4:
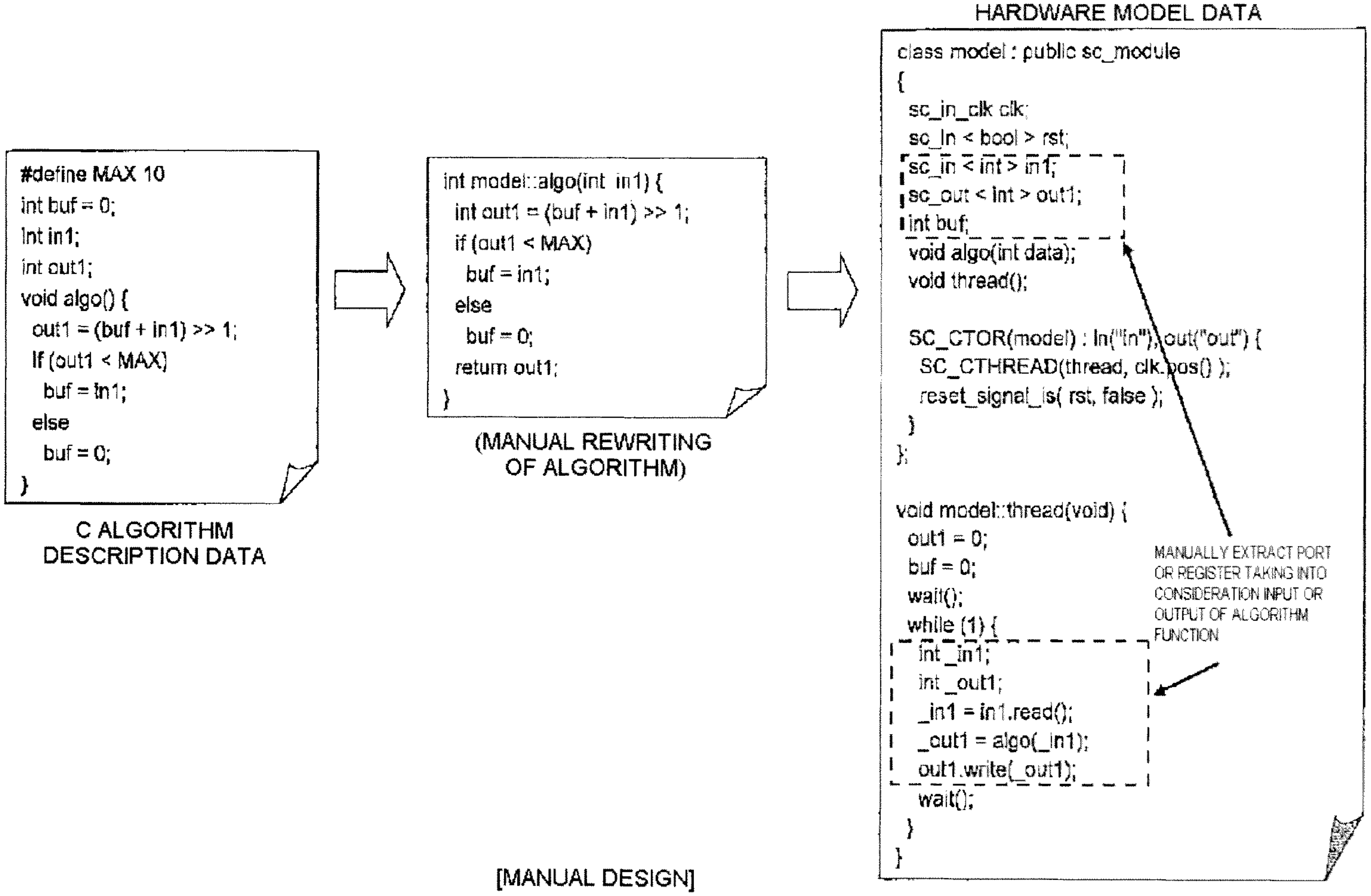
FIG. 4 is an explanatory view illustrating, as a comparative example, the result of manually converting the C algorithm description data into the hardware model data.

An explicit difference appears in the description form of the hardware model between the case of manual conversion of FIG. 4 and the case of automatic conversion of FIG. 3 using the present invention. Regardless of using which of the conversion methods of FIG. 3 or FIG. 4, it is necessary in either case to extract variables to be inputs and outputs of the functions in the algorithm description data.

In the case of manual conversion of FIG. 4, the algorithm description is rewritten so that variables to be inputs and outputs become arguments and return values of the functions. This is because it is required to clarify the interface so that a person can easily understand the model description.

In the case of automatic conversion of FIG. 3 using the present invention, on the other hand, the algorithm processing is converted into the hardware description by a conversion scheme considering data dependency, by specifying from the outside which of the variables become inputs and outputs.

Figure 5:
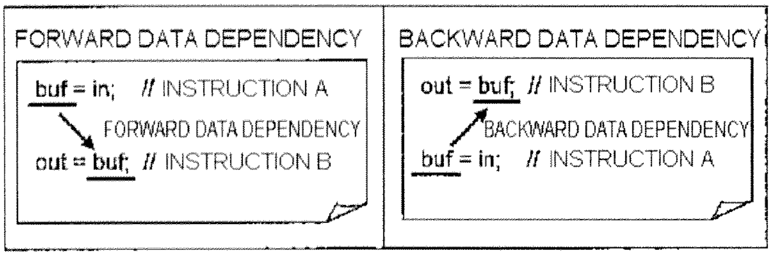
FIG. 5 is an explanatory view illustrating exemplary data dependency and backward data dependency.

Here, data dependency is one of the constraints in executing software and, when an instruction B uses a execution result of an instruction A, it is said that there exists data dependency in variables exchanged between the instruction A and the instruction B. Here, it is referred to as forward data dependency if the instruction A is executed prior to the instruction B in the software code, whereas it is referred to as backward data dependency if the instruction B is executed earlier. Examples of forward data dependency and backward data dependency are shown in FIG. 5. Although the instruction A substitutes "in" to "buf" and the instruction B substitutes "buf" (result of execution of the instruction A) to "out" in both description examples at the right and left sides, the instruction A precedes the instruction B at the left side, whereas the instruction B precedes the instruction A at the right side.

When there exists a variable with data dependency, it becomes necessary to consider preservation of the dependency to maintain equivalence of functions in automatic conversion. Details thereof will be described below.

As has been outlined based on FIG. 1, since a functionally equivalent hardware model can be automatically generated with an algorithm written in C language being the input, it suffices to perform code analysis and debugging for the C description. In the design flow of the comparative example of FIG. 2 with manual intervention, code analysis verification and debugging are required for both the C algorithm description and the hardware model. Therefore, it will be understood that the language conversion method according to the present invention makes it possible to reduce design man-hours and inspection man-hours of the hardware model and significantly improve development efficiency of semiconductor integrated circuits or the like.

<<Automatic Conversion>>

In the following, automatic conversion which assures equivalence will be described in detail.

Figure 6:
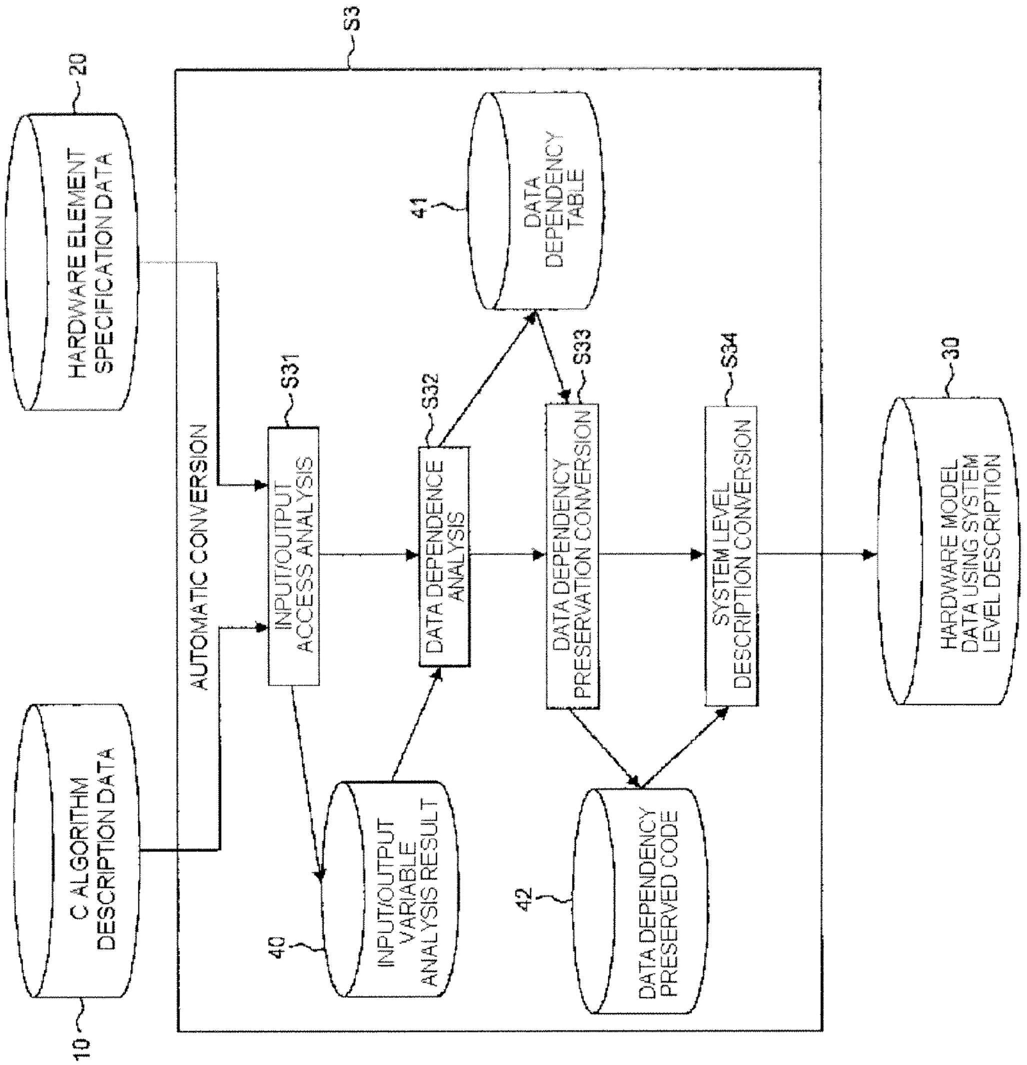
FIG. 6 is an explanatory view illustrating a specific example of the automatic conversion S3 of FIG. 1.

FIG. 6 illustrates a specific example of the automatic conversion 53 of FIG. 1. In the automatic conversion S3, the C algorithm description data 10 and the hardware element specification data 20 are input, and input/output access analysis S31, data dependency analysis S32, data dependency preservation conversion S33, and system level description conversion S34 are performed, for example, based on input data.

In the input/output access analysis S31, the C algorithm description data is parsed to analyze input/output access, and the analysis result of the input variable and the output variable in the description (input/output variable analysis result) is stored in a database 40.

In the data dependency analysis S32, locations of codes having data dependency are extracted referring to the database 40 of the input/output variable analysis result and a data dependency table 41 is created.

In the data dependency preservation conversion S33, a code preserving data dependency is rewritten, referring to the data dependency table 41, and stored in a database 42 as a data dependency preserved code. The data dependency preserved code is treated as an intermediate code, although not particularly limited thereto.

In the system level description conversion S34, the hardware model data 30 based on the system level description is generated, using the data dependency preserved code held in the database 42.

The language conversion program for performing automatic conversion is downloaded to the work memory 3 of FIG. 7 and executed by the CPU 2. The C algorithm description data 10 and the hardware element specification data 20 for use in the automatic conversion by the CPU 2 are stored in the auxiliary memory 4 via the external interface 5. The database 40 of the input/output variable analysis result and the data dependency table 41 generated by the automatic conversion performed by the CPU 2 are held in the work memory 3, whereas the intermediate code (data dependency preserved code 42) generated midway of the conversion and the hardware model data 30 as the conversion result can be acquired from the auxiliary memory 4.

<<Data Dependency Preservation Conversion>>

Next, data dependency preservation conversion will be specifically described.

FIG. 8 illustrates an exemplary process description when there is forward data dependency. In the data dependency preservation conversion S33, a variable to be mapped to the input or output is substituted with a process to be port access, for example, based on the data dependency. On this occasion, a simple substitution may ruin the data dependency. This is because the concept of time is not reflected in the C algorithm description, whereas the System C description has the concept of time, and thus the value of the variable may be updated when the clock, which is grasped by the concept of time, ticks (when the clock cycle is changed). For example, an unintended process result may be acquired if there exists forward data dependency with regard to the variable out1 in the C algorithm description of FIG. 8 and a simple substitution is performed as shown in the "non-equivalent" arrow direction of FIG. 8. In the hardware model description using System C, there may be a case where substitution for an output port or a signal becomes a non-blocking substitution and the value is actually updated at the timing of the next clock tick (e.g., a call of "wait"). In other words, although the value substituted into the out1 is used in evaluation in the next "if" statement, the value of out1 is not immediately reflected in the HW model, and thus the both processing results do not agree.

To solve the above problem, an intermediate variable is introduced. In the code indicated by the "equivalent" arrow direction of FIG. 8, the updated value is substituted into the intermediate variable _out1, and the value of the intermediate variable _out1 is substituted into the variable out1. By rewriting the process to use the intermediate variable _out1 for referencing a value, functional equivalence between the C algorithm description and the hardware model description can be guaranteed. Here, in1.read( ) is a read method which reads data from the input port in1, and out1.write ( ) is a method which writes data into the output port out1.

The significant difference from the manual hardware modeling technique as shown in the comparative example lies in the part that uses a variable in the algorithm description directly as the port without having to additionally define a port. If the above technique is attempted to be manually performed, rewriting the algorithm with data dependency taken into account requires grasping the dependency by visually tracking the usage of variables in the order of execution, which is usually very difficult, and therefore it is very likely that the task will not converge.

FIG. 9 illustrates an exemplary process description when there is backward data dependency. In this case, backward data dependency with regard to the variable out1 exists in the C algorithm description and, a simple substitution as indicated by the "non-equivalent" arrow direction may lead to an unintended result because the variable out1 is substituted in a non-blocking manner. The disadvantage is overcome as with the foregoing by introducing a similar intermediate variable similarly to the case of forward data dependency, as indicated by the "equivalent" arrow direction.

Figure 10:
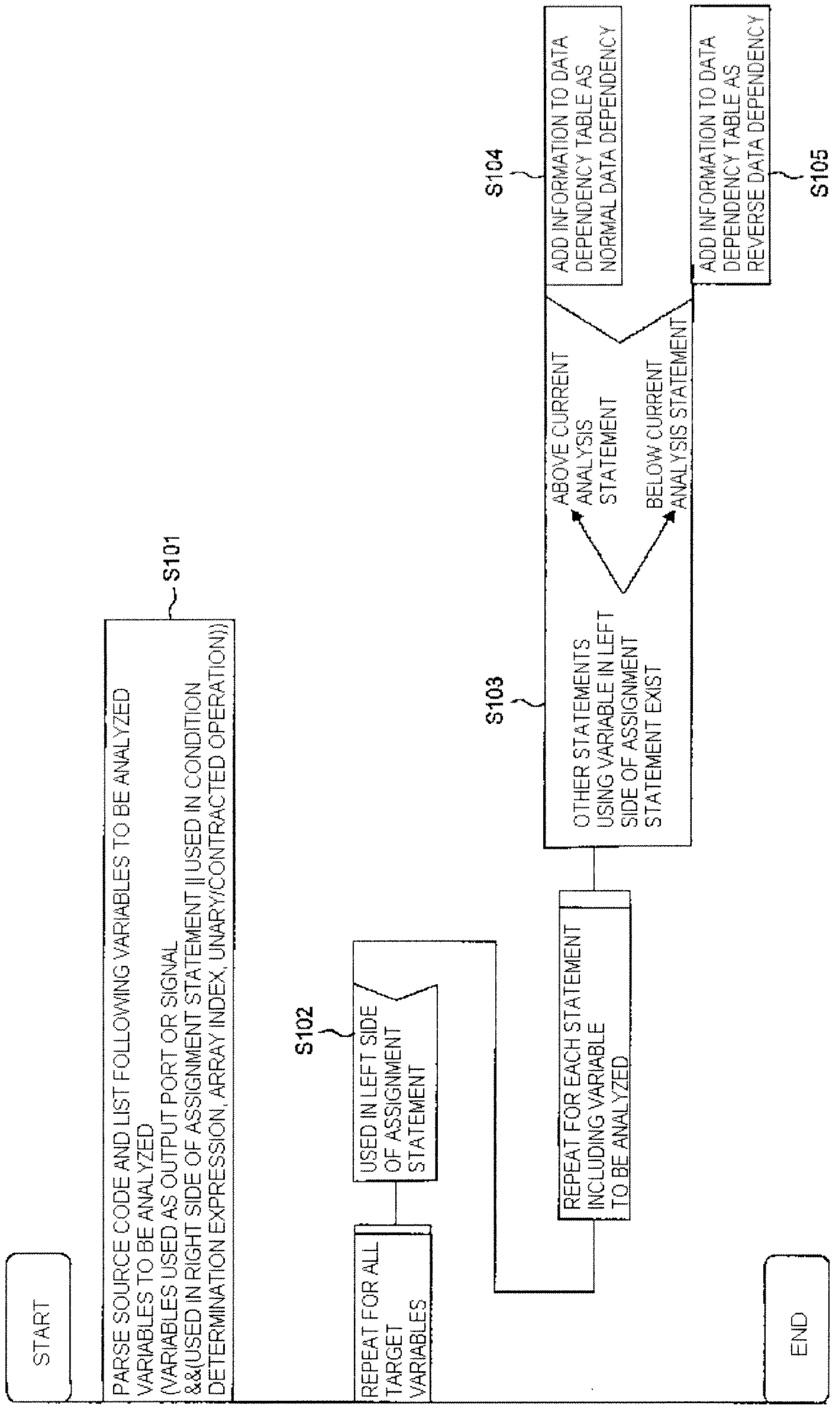
FIG. 10 is a flowchart illustrating a data process flow of the data dependency analysis.
Figure 12:
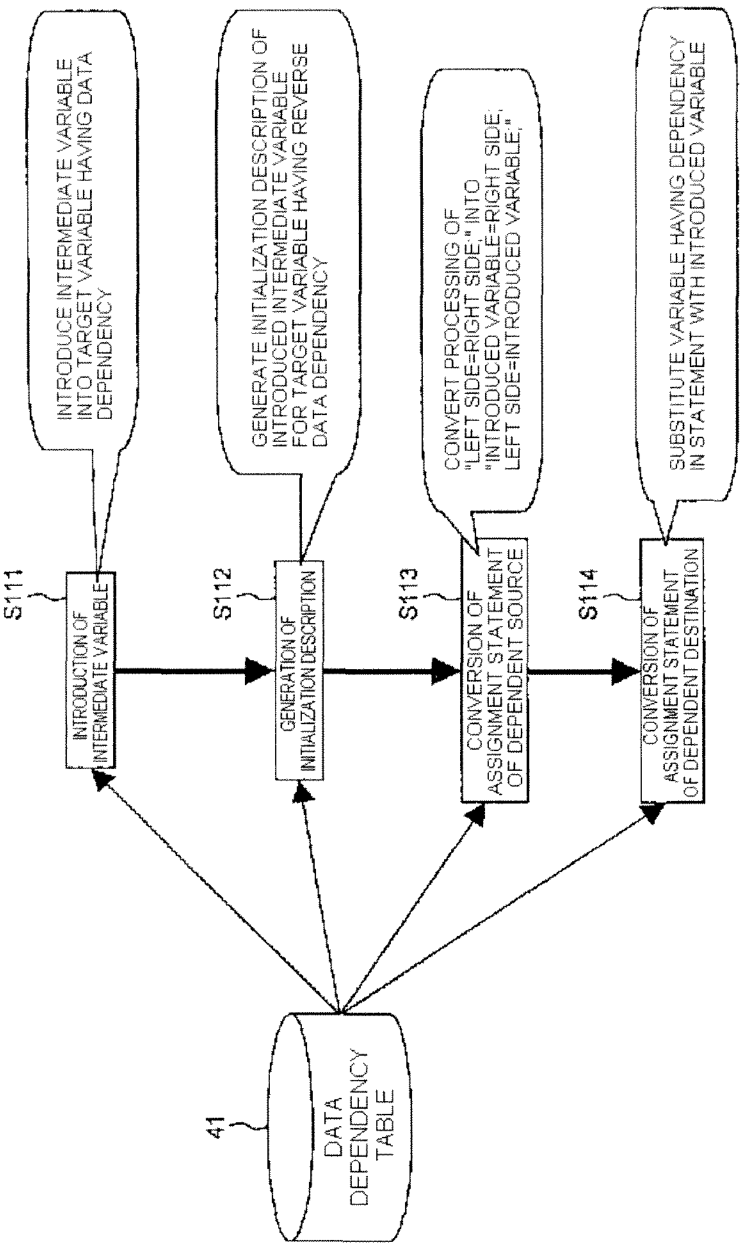
FIG. 12 is a flow chart illustrating detailed data processing of the data dependency preservation conversion S33.

FIG. 10 illustrates a data process flow of the data dependency analysis. FIG. 11 illustrates an exemplary data dependency table, and FIG. 12 illustrates a detailed data process flow of the data dependency preservation conversion S33.

The process flow of the data dependency analysis illustrated in FIG. 10 determines which of reference or substitution comes first according to the order of description lines in the algorithm description and generates the data dependency table 41 of FIG. 11.

The data dependency analysis illustrated in FIG. 10 interprets (parses) the meaning of the C algorithm description written in source code characters to provide a listing of target variables (S101). A target variable refers to a variable satisfying the relation of (a variable used as an output port or a signal && (used in right side of assignment statement || used in condition determination expression, array index, unary/contracted operation)). In other words, a variable used in the right side of the assignment statement, used in a condition determination expression, used in an array index, or used in a unary/contracted operation, and used as an output port or a signal is treated as a target variables.

Next, for each of the all target variables, it is determined whether there exists a variable used in the left side of the assignment statement (S102). If such a variable exists, the process of step S103 is repeated for each statement including the variable to be analyzed. At step S103, it is determined whether or not another statement using the variable in the left side of the assignment statement exists above the current analysis statement and, for a variable satisfying the condition of step S103, information indicating that it has forward data dependency is added to the data dependency table (S104), or otherwise, information indicating that the variable has backward data dependency is added to the data dependency table (S105).

The data dependency preservation conversion of FIG. 12 creates a data dependency preserved code 42, using the information of data dependency table 41 as an input. The data dependency preserved code 42 will be used as an input to the system level description conversion S34 of a subsequent stage.

The data dependency preservation conversion of FIG. 12 is realized by processes of introducing an intermediate variable (S111), generating an initialization description (S112), converting the assignment statement of dependent source (S113), and converting the assignment statement of dependent destination (S114). The intermediate variable introduction S111 is a process of introducing an intermediate variable into a target variable having data dependency. The initialization description generation S112 is a process of generating, for a target variable having backward data dependency, an initialization description of the introduced intermediate variable. The conversion of the assignment statement of dependent source S113 is a process of converting the process of "left side=right side;" into "introduced variable=right side; left side=introduced variable;". The conversion of the assignment statement of dependent destination S114 is a process of substituting a variable having dependency in a statement with the introduced variable.

Figure 13:
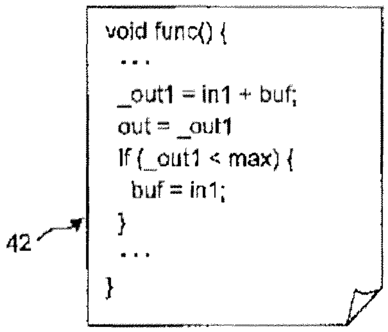
FIG. 13 is an explanatory view illustrating data dependency preserved code generated for description of the forward data dependency of FIG. 8.

The process flow of FIG. 10 will be described using the exemplary forward data dependency of FIG. 8, for example. According to the process flow of FIG. 10, the variable out1 satisfies the condition of being a target variable at step S101 (variable used as output port or signal && used in condition determination expression) because a process line "if (out1<max) {" exists, and satisfies the condition at step S102 because it is used in the left side of the assignment statement "out1=in1+buf;". It is further determined at step S103 that there exists forward data dependency because there exists a condition determination expression using the variable out1 below the assignment statement of the variable out1, and thus information of substitution line of out1 (line number being , variable being out1, type being substitution), and information of reference to out1 based on forward data dependency (line number being , variable being out1, type being reference, dependency being forward dependency) are added to the data dependency table 41 of FIG. 11. Subsequently, according to the process flow of FIG. 12, an intermediate variable such as _out1 is introduced at S111, referring to the generated data dependency table 41, conversion of the assignment statement of dependent source is performed at step S113, and conversion of the assignment statement of dependent destination is performed at step S114. As a result thereof, the data dependency preserved code 42 shown in FIG. 13 is created.

Figure 14:
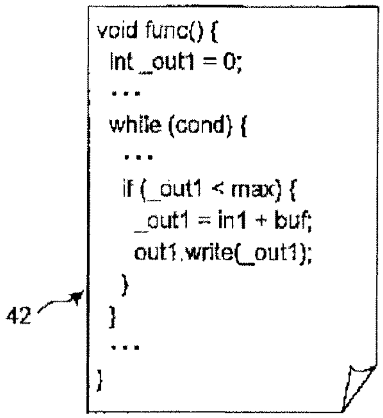
FIG. 14 is an explanatory view illustrating data dependency preserved code generated for the description of the backward data dependency of FIG. 9.

Similarly, the process flow of FIG. 10 will be described using the exemplary backward data dependency description of FIG. 9. According to the process flow of FIG. 10, the variable out1 satisfies the condition of being a target variable at step S101 (variable used as output port or signal && used in condition determination expression) because a process line "if (out1<max) {" exists, and satisfies the condition at step S102 because it is used in the left side of the assignment statement "out1=in1+buf;". It is further determined at step S103 that there exists backward data dependency because there exists a condition determination expression using the variable out1 above the assignment statement of the variable out1, and thus information of substitution line of out1 (line number being , variable being out1, type being substitution), and information of reference to out1 based on backward data dependency (line number being , variable being out1, type being reference, dependency being backward dependency) are added to the data dependency table 41 of FIG. 11. Subsequently, according to the process flow of FIG. 12, an intermediate variable such as _out1 is introduced at S111, referring to the generated data dependency table 41, an initialization description of the intermediate variable is generated at step S102, conversion of the assignment statement of dependent source is performed at step S103, and conversion of the assignment statement of dependent destination is performed at step S104. As a result thereof, a data dependency preserved code 42 shown in FIG. 14 is created.

As described above, it is not necessary to generate a CDFG (Control Data Flow Graph) in order to generate data dependency, which contributes to reducing development cost of the language conversion method and increasing the speed of conversion according to the present invention. Here a CDFG refers to a graph of all the paths which may be passed through when the program is executed, and expresses the flow of data (data flow) appearing in the operation description and the flow of control (control flow) of the order of execution of respective operations. It is frequently used for compiler optimization or static code analysis tools.

<<Description Constraint of C Algorithm>>

In the hardware model described by the above-mentioned System C language, it may be advantageous to provide, according to whether the process is a method process SC_METHOD or a synchronous thread process SC_CTHREAD, a predetermined description constraint on the C algorithm description to be an input, in order to guarantee functional equivalence before and after the above-mentioned data dependency preservation conversion.

If, for example, the system level description after conversion is based on System C language and the parallel process is converted into the method process SC_METHOD, it suffices to provide the constraints 1, 2, 3, and 4 described below. Under these constraints, all the output series coincide for the same input sequence before and after conversion. On the other hand, it suffices to provide the constraints 2, 3, and 5 descried below if the parallel process is converted into the clock synchronous thread process SC_CTHREAD. Under these constraints, the output cycles differ by only 1 cycle, that is, all the output series coincide before and after conversion neglecting the difference of 1 cycle.

Constraint 1: There is no description to be a combination gate loop.

Constraint 2: There is no variable to be used as an internal signal by which read and write operations are both performed.

Constraint 3: There is no read operation of a variable to be used as an output port or, when a read operation is performed, there is no writing into the variable from a function to be another parallel process. In other words, variable to be used as an output port must not be used as an input/output, variable.

Constraint 4: Input vectors are cycle-synchronized.

Constraint 5: The description is provided that the operation is completed in one clock cycle.

<<System Level Description Conversion>>

Next, the system level conversion S34 will be described in detail.

Figure 15:
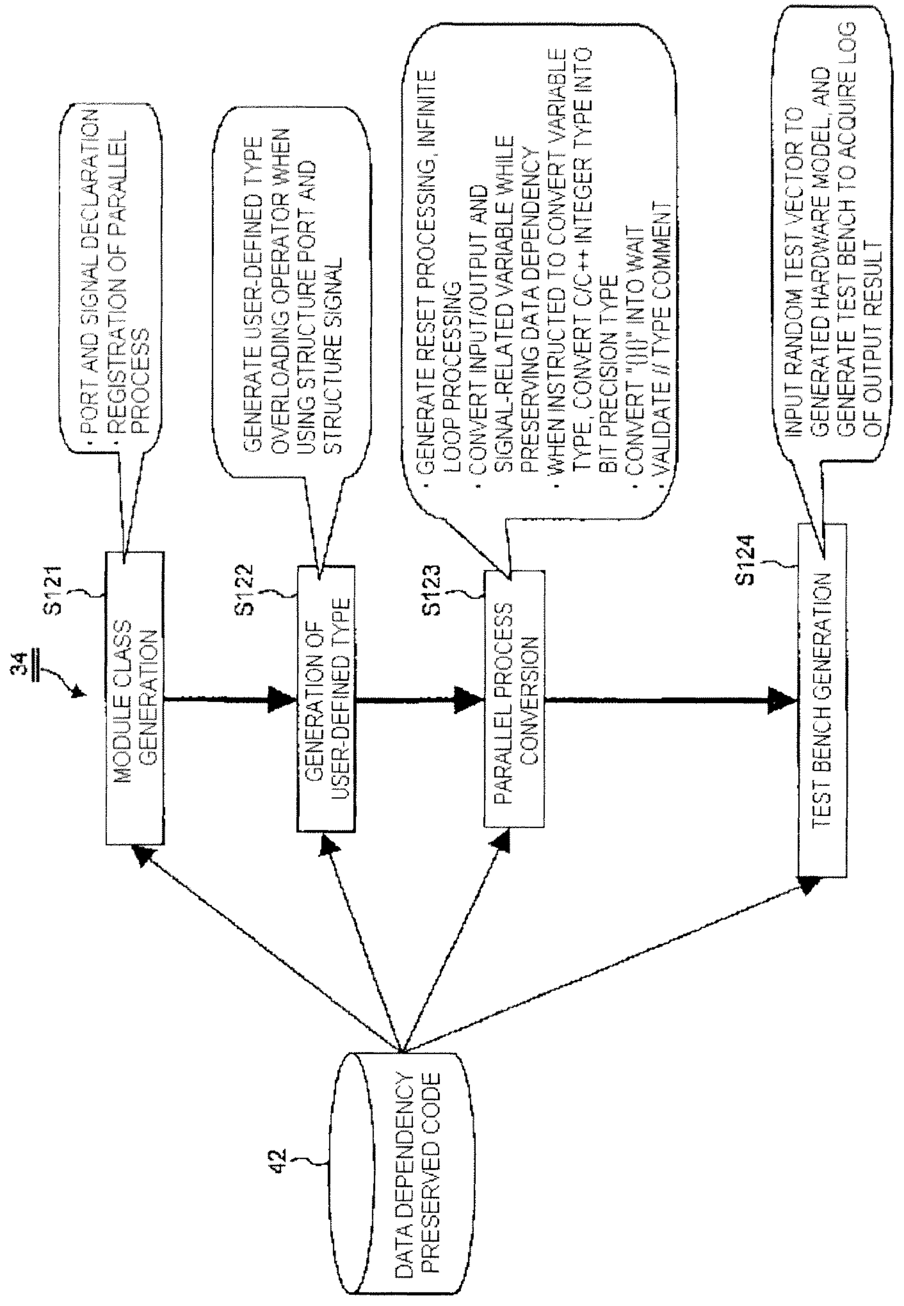
FIG. 15 is a flow chart illustrating a specific example of the system level conversion S34.

FIG. 15 illustrates a specific example of a process flow of the system level conversion S34. The system level conversion S34 is realized by module class generation S121, user-defined type class generation S122, parallel process conversion S123, and test bench generation S124. The system level conversion S34 uses the data dependency preserved code (intermediate code) 42 generated in data dependency preservation conversion S33 and the hardware element specification data 20 to generate, by the four steps S121 to S124, the hardware model data 30 using the system level description.

In the module class generation S121, a description such as port and signal declaration, registration of a parallel process, or the like is generated as the declaration of the class of the hardware model. If data type conversion is instructed, referring to the hardware element specification data 20 of this occasion, the original type is converted into the instructed type. For example, if there is an instruction to convert the "int" type of the C integer type into sc_int<24>, which is the System C data type, variables defined by the "int" type are converted into the sc_int<24> type. Here, the module is supposed to be a class which is the basic element of design in System C language, and has processes, ports, channels, and other modules as members.

In the user-defined type class S122, a user-defined type class overloading operators is generated when a structure port and a structure signal are supposed to be generated. This is required in order to allow normal operators to be used in a process description using a structure port and a structure signal (so that no compilation error occurs). Operators to be overloaded include "==", "!=", "=", "^=", "|=", "&=", "<<=", ">>=", "%=", "/=", "*=", "+=", "−=", "+", "−", "++", "−−", "<<", "<<", or the like, and internal implementation of the operators is such that processing of a corresponding operator is individually performed for each data member of a structure.

In the parallel process conversion S123, a parallel process description of the hardware model is generated from the C algorithm. The hardware model description is generated using a reset processing or an infinite loop process, while preserving data dependency of variables related to input/output signals. If data type conversion is instructed referring to the hardware element specification data 20, on this occasion, the original model is converted into the instructed model. Data dependency can be acquired referring to the data dependency preserved code 452 generated in the data dependency preservation conversion.

Furthermore, in the parallel process conversion S123, the "{ } { }" described in the C algorithm as a description conversion rule is converted into a description of the clock boundary (wait( ) call in System C). With regard to this information, it is also possible to specify, from the hardware element specification data 20, which line of the source code the clock boundary will be inserted in. Embedding the description meaning the clock boundary within the C algorithm description is expected to better improve clarification and readability of the meaning. In addition, no adverse effect will arise as a functional operation because it is a meaningless process description when operated as a C algorithm.

As a description conversion rule, a "//" type comment described in the C algorithm becomes an effective description in the hardware model by negating the comment symbol"//". This is prepared for the purpose of assisting conversion by preliminarily embedding, within the C algorithm, a description specific to the hardware model which cannot be supported by automatic conversion.

In the test bench generation S124, test benches capable of confirming the operation of the C algorithm and the generated system level description (hardware model data) are respectively generated. It is possible to input a same random test vector to the C algorithm and the hardware model data and acquire logs of output results respectively. Comparing the output results makes it possible to confirm whether or not the hardware model generated by the conversion is functionally equivalent to the original C algorithm description. The test bench for the hardware model is a model which can be concatenated to the hardware model via a port, and has an autonomous operation process. In this process, random test vectors are provided to the input port at a regular interval, and the operation of recording the signal values acquired from the output port to the log file is repeated for a certain number of times. An instance of the hardware model and the test bench model is created to provide coupling between the ports, and a description of performing a simulation is also generated. On the other hand, the test bench for the C algorithm generates a random test vector, calls the algorithm function, and repeats the operation of recording the processing results to the log file for a certain number of times.

Here, generation of the test bench is not essential. A bug-free system level description can be acquired without evaluation and response thereof using a test bench, as long as the automatic conversion S3 is performed on the C algorithm description satisfying a predetermined description constraint and having errors removed by debugging. A test bench is regarded as supplementary for a disadvantage that no evaluation environment is provided in a case where such a description constraint is not complied with.

Employing the automatic conversion S3 described above in the language conversion method provides the following operational advantage. That is, man-hours of creating a hardware model which has been manually developed can be significantly reduced, and it also becomes possible to acquire a bug-free hardware model which is functionally equivalent to the algorithm description. Accordingly, it becomes possible to reduce not only man-hours for rewriting into the hardware model but also man-hours for code analysis verification and debugging of the hardware model which have been conventionally performed, whereby degradation of reliability due to bugs resulting from manual work can also be avoided. Furthermore, generating a CDFG (control data flow graph) is not necessary for generating data dependency, which contributes to reducing development cost of the language conversion method and increasing the speed of conversion.

<<Specific Example of Language Conversion Method>>

A further specific example of processing according to the above-mentioned language conversion method will be described, referring to FIGS. 16 to 23.

In FIG. 16, the C algorithm description data 10 and the hardware element specification data 20 are prepared as input data for the automatic conversion S3 of FIG. 6. It is assumed that code analysis verification and debugging for C algorithm description data as the input have already been completed. In FIG. 16, a source section 10*s* and a header section 10*h* are illustrated as the C algorithm description data 10.

In the input/output access analysis S31 of the automatic conversion S3, the global variable in1 in the C algorithm description data 10 is recognized as an input port, the global variable out1 is recognized as an output port, and the global variables sig1 and sig2 are recognized as signals.

In the data dependency analysis S32 of the automatic conversion S3, it is recognized by the process flow of FIG. 10 that there exists forward data dependency in the variable out1 used in the C algorithm description data (source section), and the data dependency table 41 as illustrated in FIG. 11 is generated.

In the data dependency preservation conversion S33 of the automatic conversion S3, the data dependency preserved code 42 as illustrated in FIG. 17 is generated by the process flow of FIG. 12.

In the system level description conversion S34 of the automatic conversion S3, the class definition section of the hardware model illustrated in FIG. 18, the user-defined type class illustrated in FIG. 19, the parallel process illustrated in FIG. 20, and codes of the test bench illustrated in FIGS. 21 to 23 are respectively generated by the process flow of FIG. 15.

In FIG. 18, DS1 is a description of port declaration, DS2 is a description of signal declaration, and DS3 is a description of registration of a parallel process. In the registration of the parallel process, the synchronous thread process SC_CTHREAD is registered. In FIG. 19, DS4 is a description of overloading of an operator. In FIG. 20, DS5 is a description of reset processing, and DS6 is a description of an infinite loop. In FIG. 21, DS7 is a description of random test vector generation, and DS8 is a description of log acquisition of an output result. In FIG. 22, DS9 is a module description of hardware model creation, DS10 is a module description of test bench model creation, and DS11 is a description of concatenation of the hardware model and the test bench model. In FIG. 23, DS12 is a description of random test vector generation, and DS13 is a description of a call of an algorithm function and log acquisition of an output result.

The generated hardware model data 30 is converted into RTL data by a known high-level synthesis technique, or the like.

Second Embodiment

In the Second Embodiment, a language processing conversion method which does not require the hardware element specification data 20 will be described. To eliminate the need for the hardware element specification data 20, a meaning is provided for the hardware element with regard to the input/output attribute or the parallel process by the variable names, the structure names, and the naming rule for function names used in the C algorithm. For example, the following naming rule is employed. (1) Integer type global variables beginning with “in/out/sig” are treated as input ports/output ports/signals, respectively. (2) Global functions beginning with “th” are treated as parallel processes.

When employing this naming rule, the automatic conversion S3 of FIG. 6 receives only the C algorithm description 10 as an input. The input/output access analysis S31 parses the C algorithm description, analyzes the input/output access based on the name rule, and stores the result of input/output variable analysis in the database 40.

In the C algorithm illustrated in FIG. 24, the variable in1 becomes an input port, the variable out1 becomes an output port, the variables sig1 and sig2 become signals, and the functions th_1 and th_2 become parallel processes, according to the naming rule. Since the processing hereafter is similar to that of First Embodiment, detailed description thereof is omitted. Here, the naming rule is annotated as a comment in FIG. 24, taking into account readability of the description.

According to the Second Embodiment, similarly to the First Embodiment, when the algorithm description is converted into the system level description expressing the concept of time and parallel processing specific to hardware, the data dependency assumed in the algorithm description satisfying the description constraint is preserved by the data dependency preservation description, with the result of previous evaluation and verification for the algorithm description being reflected in the hardware model which has been converted from the algorithm description into the system level description, and therefore evaluation and verification such as code analysis and debugging need not be repeated even if a different language is used for the converted hardware model. Furthermore, since the parameters representing hardware elements are automatically determined based on the naming rule, data such as the hardware element specification data is not required.

Third Embodiment

The language conversion program which controls the automatic conversion S3 described above is provided in a manner stored on the DVD9*d* of FIG. 7, although not particularly limited thereto. The DVD9*d* is an information recording medium which can be read by the work station 1 via the DVD drive 9 device. Although not particularly illustrated, the language conversion program may be downloaded by the workstation 1 via a communication network. The language conversion program is provided as an object program corresponding to the machine language of the work station 1. It suffices that the control functions by the language conversion program realize the automatic conversion S3 described above based on FIGS. 1 to 24. It suffices to provide functions to control, for example, the input/output access analysis S31, the data dependency analysis S32, the data dependency preservation conversion S33, and the system level description conversion S34 of FIG. 6, detailed description thereof will not be repeated.

Providing such a language conversion program makes it easy to realize the automatic conversion S3 for the language conversion described above.

Although the invention made by the inventors has been specifically described based on embodiments, it is needless to say that the invention is not limited thereto and may be modified in various ways within a range that does not deviate from the spirit thereof.

For example, the program description language is not limited to C language and may be JAVA (registered trademark) or other languages. Accordingly, the system description language can be changed as appropriate without being limited to System C language. The descriptions illustrated in FIGS. 16 to 24 are examples, in which contents of processes, types of parameters, and the naming rule of parameters can be changed as appropriate.

The present invention is generally applicable to hardware models for SoC development (for either high-level synthesis or performance evaluation), and can be applied to development of circuit modules and, further, LSIs which realize, individually or in a hybrid manner, application chips of cellular phones, portable audio devices, portable video devices, vehicle-mounted audio devices, vehicle-mounted video devices, vehicle-mounted navigation systems, cryptosystems, for example.

What is claimed is:

1. A language conversion method comprising:

a first process in which a computer unit inputs algorithm description data describing an algorithm of hardware under a predetermined description constraint using a program description language;

a second process in which the computer unit inputs hardware element specification data specifying parameters representing hardware elements included in the algorithm description data; and a third process in which the computer unit converts the algorithm description data into data of a hardware model based on a system level description language, wherein, in the third process, the computer unit generates a data dependency preservation description which preserves, in the hardware model, data dependency in the algorithm description with regard to a parameter specified in the hardware element specification data.

2. The language conversion method according to claim 1, wherein the description constraint includes a constraint that, when a process based on the system level description language comprises a clock synchronous process, an operation by a function of the program description is completed within a certain clock cycle.

3. The language conversion method according to claim 2, wherein the data dependency preservation description preserves the order of substitution and reference to parameters, and assures that the substituted value is referred to within the certain clock cycle from the substitution operation thereof.

4. The language conversion method according to claim 3, wherein the data dependency preservation description includes: in the algorithm description data a description which defines an intermediate parameter for a parameter to be referred to after substitution therein, substitutes, into the intermediate parameter, a value to be substituted into the parameter, and subsequently writes the value of the intermediate parameter into the parameter; and a description which defines the reference destination of the value as the intermediate parameter.

5. The language conversion method according to claim 1, wherein the third process generates a data dependency table indicating which of reference or substitution comes first according to the order of description lines in the algorithm description, and uses the table to generate the data dependency preservation description.

6. The language conversion method according to claim 1, wherein the hardware element specification data includes information specifying a parameter to be an input port, information specifying a parameter to be an output port, and information specifying a parameter to be a register.

7. The language conversion method according to claim 1, wherein the hardware element specification data further specifies a process which performs parallel processing.

8. The language conversion method according to claim 1, wherein the algorithm description data includes a description unsupported by the program description language as a "//" type comment, and the third process reflects the "//" type description in the system level description.

9. The language conversion method according to claim 1, wherein the third process converts a description of "{ }{ }" included in the algorithm description data into a description of the clock boundary.

10. The language conversion method according to claim 1, wherein the third process includes a test bench generation process in which the computer unit generates a test bench for verifying the function and operation timing by the converted data of the hardware model.

11. The language conversion method according to claim 1, wherein the program description language is C language which lacks a concept of parallel processing and time, and the system level description language is System C language which has the concept of parallel processing and time.

12. A language conversion method comprising:

a first process in which a computer unit inputs algorithm description data describing an algorithm of hardware under a predetermined description constraint using a program description language; and a second process in which the computer unit determines parameters representing hardware elements included in the algorithm description data according to a naming rule of parameters, and the computer unit converts the algorithm description data into data of a hardware model based on the system level description language, wherein, in the second process, the computer unit generates a data dependency preservation description which preserves, in the hardware model, data dependency in an algorithm description with regard to the determined parameter.

13. The language conversion method according to claim 12, wherein the predetermined description constraint includes a constraint that, when a process based on the system level description language comprises a clock synchronous process, an operation by a function of the program description is completed within a certain clock cycle.

14. The language conversion method according to claim 13, wherein the data dependency preservation description preserves the order of substitution and reference to parameters, and assures that the substituted value is referred to within the certain clock cycle from the substitution operation thereof.

15. The language conversion method according to claim 14, wherein the data dependency preservation description includes: in the algorithm description data a description which defines an intermediate parameter for a parameter to be referred to after substitution therein, substitutes, into the intermediate parameter, a value to be substituted into the parameter, and subsequently writes a value of the intermediate parameter into the parameter; and a description which defines the reference destination of the value as the intermediate parameter.

16. The language conversion method according to claim 12, wherein the second process generates a data dependency table indicating which of reference or substitution comes first according to the order of description lines in the algorithm description, and uses the table to generate the data dependency preservation description.

17. The language conversion method according to claim 12, wherein parameters representing the hardware elements according to the naming rule include a first parameter to be an input port, a second parameter to be an output port, and a third parameter to be a register.

18. The language conversion method according to claim 12, wherein the second process further includes a process of determining a process which performs parallel processing included in the algorithm description data according to a naming rule of processes.

19. The language conversion method according to claim 12, wherein the algorithm description data includes a description unsupported by the program description language as a "//" type comment, and the second process reflects the "//" type description in the system level description.

20. The language conversion method according to claim 12, wherein the second process converts a description of "{ } { }" included in the algorithm description data into a description of the clock boundary.

21. The language conversion method according to claim 12, wherein the second process further includes a test bench generation process in which the computer unit generates a test bench for verifying the function and operation timing by the converted hardware model data.

22. The language conversion method according to claim 12, wherein the program description language is C language which lacks a concept of parallel processing and time, and the system level description language is System C language which has the concept of parallel processing and time.

23. A language conversion program stored on a non-transitory computer readable medium which controls, by causing a computer unit to execute a method, comprising:

a first process of inputting algorithm description data describing an algorithm of hardware under a predetermined description constraint using a program description language;

a second process of inputting hardware element specification data specifying parameters representing hardware elements included in the algorithm description data;

a third process of generating a data dependency preservation description for specifying data dependency in the algorithm description with regard to a parameter specified in the hardware element specification data which has been input in the second process; and a fourth process of converting the algorithm description data into hardware model data based on the system level description language and reflecting, in the hardware model, the data dependency specified by the data dependency preservation description.

24. A language conversion program stored on a non-transitory computer readable medium which controls, by causing a computer unit to execute a method, comprising:

a first process of inputting algorithm description data describing an algorithm of hardware under a predetermined description constraint using a program description language;

a second process of determining parameters representing hardware elements included in the algorithm description data according to a naming rule of parameters;

a third process of generating a data dependency preservation description for specifying data dependency in the algorithm description with regard to a parameter determined in the second process; and a fourth process of converting the algorithm description data into data of a hardware model based on the system level description language and reflecting, in the hardware model, the data dependency specified by the data dependency preservation description.

25. The language conversion method according to claim 1, wherein the description constraint includes a constraint that, when a process based on a clock synchronous process, an operation by a function of the program description is completed within a certain clock cycle.

26. The language conversion method according to claim 1, wherein the third process includes a test bench generation process for verifying the function and operation timing.

* * * * *